United States Patent
Thei et al.

(10) Patent No.: US 6,335,249 B1
(45) Date of Patent: Jan. 1, 2002

(54) SALICIDE FIELD EFFECT TRANSISTORS WITH IMPROVED BORDERLESS CONTACT STRUCTURES AND A METHOD OF FABRICATION

(75) Inventors: Kong-Beng Thei; Ming-Ta Lei; Shou-Gwo Wuu, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/498,981

(22) Filed: Feb. 7, 2000

(51) Int. Cl.[7] .............................................. H01L 21/336
(52) U.S. Cl. ...................... 438/296; 438/296; 438/305; 438/592
(58) Field of Search ................................ 438/231, 233, 438/305, 533, 592, 664, 683, 296

(56) References Cited

U.S. PATENT DOCUMENTS

| | | | |
|---|---|---|---|
| 4,443,930 A | * 4/1984 | Hwang et al. | 29/571 |
| 5,422,308 A | * 6/1995 | Nichols et al. | 437/192 |
| 5,679,590 A | * 10/1997 | Mori et al. | 437/43 |
| 5,702,972 A | 12/1997 | Tsai et al. | 437/56 |
| 5,744,395 A | 4/1998 | Shue et al. | 438/305 |
| 5,840,624 A | 11/1998 | Jang et al. | 438/624 |
| 5,858,846 A | 1/1999 | Tgai et al. | 438/303 |
| 5,899,742 A | 5/1999 | Sun | 438/682 |
| 6,169,020 B1 | * 1/2001 | Kim et al. | 438/597 |
| 6,171,893 B1 | * 1/2001 | Wu | 438/200 |

* cited by examiner

Primary Examiner—John F. Niebling
Assistant Examiner—Angel Roman
(74) Attorney, Agent, or Firm—George O. Saile; Stephen B. Ackerman

(57) ABSTRACT

A process for making improved borderless contact structure to salicide field effect transistors (FETs) has been achieved. Salicide FETs are formed on device areas surrounded by a shallow trench isolation (STI) using a first rapid thermal anneal (RTA-1) to form a metal silicide on the source/drain contacts and the gate electrodes, and a second rapid thermal anneal (RTA-2) is delayed until after forming a borderless contact opening structures to the source/drain areas of the FETs. An etch stop (Si3N4) layer and an interlevel dielectric (ILD) layer is deposited, and borderless contact openings, extending over the STI, are etched in the ILD and etch stop layers to the source/drain areas. The contact openings across the substrate must be over-etched to insure that all contacts are open. This results in over-etched region in the STI at the source/drain-STI interface that result in source/drain-to-substrate shorts when metal plugs are formed in the contact openings.

20 Claims, 2 Drawing Sheets

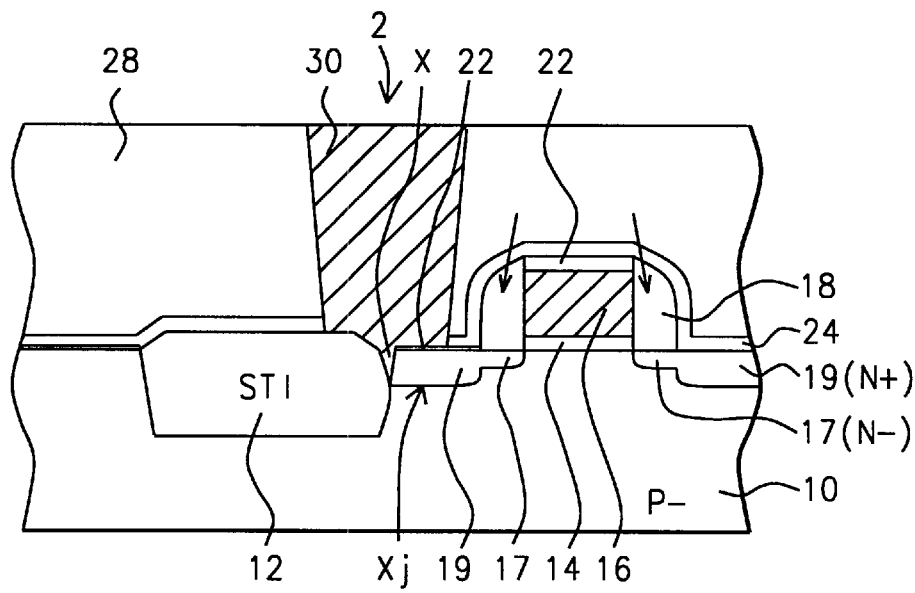
FIG. 1 – Prior Art
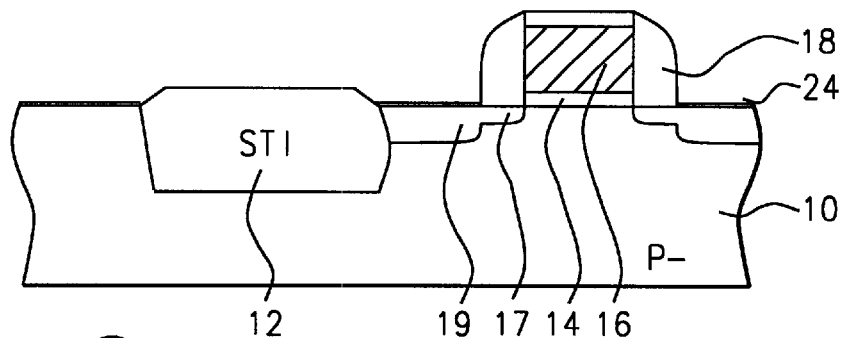
FIG. 2
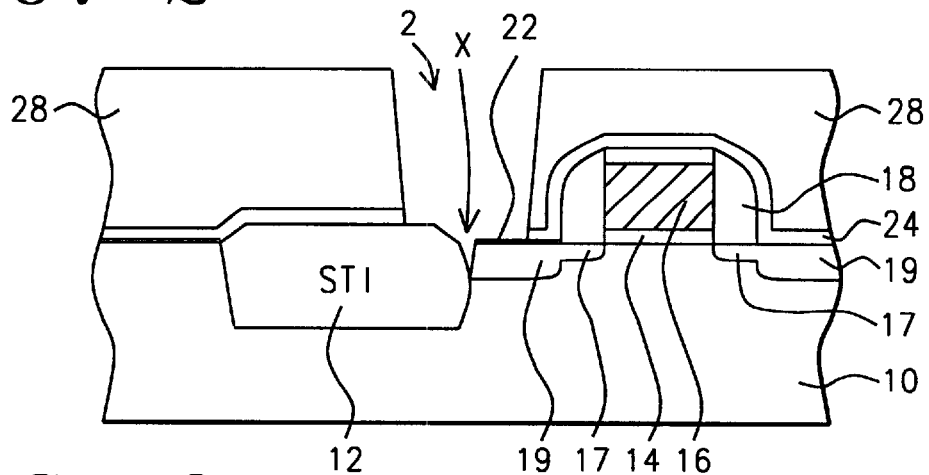
FIG. 3

US 6,335,249 B1

SALICIDE FIELD EFFECT TRANSISTORS WITH IMPROVED BORDERLESS CONTACT STRUCTURES AND A METHOD OF FABRICATION

BACKGROUND OF THE INVENTION (1) Field of the Invention

The present invention relates to the fabrication of integrated circuit devices on semiconductor substrates, and more particularly relates to a method for making an improved borderless contacts integrated with salicide field effect transistors. The method utilizes a contact implant and a delayed second rapid thermal anneal (RTA-2) to make a new contact structure having lower source/drain-to-substrate leakage currents and thereby higher product yields than the prior art borderless contact structures.

(2) Description of the Prior Art

As the semiconductor industry moves to smaller device feature sizes for ultra large scale integration (ULSI), the circuit performance is expected to improve. To achieve these smaller feature sizes it is necessary to use self-aligned techniques, such as self-aligned silicide (SALICIDE) processes for making field effect transistors (FETs). To further increase circuit density it is also necessary to etch contact openings that extend over the edges of underlying contact areas, commonly referred to as borderless contacts. One structure on semiconductor integrated circuits where borderless contacts are of particular importance for increasing circuit density is the contacts to the shallow diffused source/drain areas of the salicide FET.

Unfortunately when making salicide FETs with borderless contacts to source/drain areas several processing problems arise that result in electrical shorts and there-fore degrade the product yield. To better understand the problem associated with making these borderless contacts a schematic cross section view of a conventional Salicide FET device in and on a device area is shown for the prior art in FIG. 1. These conventional Salicide FETs are formed on a semiconductor substrate 10, composed of a single crystal silicon (Si). Field oxide 12 regions are formed first in and on the substrate 10 surface to electrically isolate device areas. The preferred isolation for current high density circuits is a shallow trench isolation (STI) 12. The detailed process steps are not shown for making the STI, but consist of forming a pad oxide and depositing a silicon nitride hard mask layer. The silicon nitride ($Si_3N_4$) layer is patterned to leave portions over the device areas and shallow trenches 2 are etched in the substrate between the device areas. The trenches are then filled by chemical vapor deposited with an insulating material, such as silicon oxide ($SiO_2$). The CVD-$SiO_2$ is etched or chemical-mechanically polished back to the hard mask to form the STI 12. The hard mask and pad oxide, which is not shown in FIG. 1, are then selectively removed, for example using a hot phosphoric acid etch to remove the $Si_3N_4$ followed by a buffered hydrofluoric acid (BHF) to remove the pad oxide A gate oxide 14 is formed on the device areas and conductively doped polysilicon layer is deposited and patterned by anisotropic plasma etching to form the FET gate electrode 16. Next, a first ion implantation is carried out to form lightly doped source/drain region 17 in the device areas adjacent to the FET gate electrode. A conformal insulating, such as a chemical vapor deposited (CVD) silicon oxide ($SiO_2$) layer, is deposited and aniso-tropically plasma etched back to form sidewall spacers 18. A second ion implantation is then carried out to form low resistant diffused source/drain contact areas 19 in and on the silicon substrate. After removing any native oxide that may have grown on the polysilicon gate electrode 16 and the silicon source/drain contact areas 19 a refractory metal, such as Titanium (Ti) is deposited. The substrate 10 is then subjected to a first rapid thermal anneal to form a Titanium silicide ($TiSi_x$) 22 on the exposed polysilicon gate electrode 16 and on the source/drain contact areas 19. The unreacted Ti on the oxide surfaces (e.g. spacers 18, STI 12) using a wet etching solution. A second RTA is then carried out to complete the $TiSi_2$ phase transition. The second RTA converts the $TiSi_x$ to a stable $TiSi_2$ layer having low sheet resistance. When cobalt (Co) is used the second RTA converts the $CoSi_x$ to a stable $CoSi_2$ silicide layer also having a low sheet resistance. The two-step process is commonly used rather than a single-step to avoid rapid diffusion of the Si atoms in the metal (Ti or Co) layer that would result in bridging across the sidewall spacers and between the source/drain areas and polysilicon gate electrodes. Next, a relatively thin conformal etch-stop/barrier layer 24 is deposited, such as a silicon nitride ($Si_3N_4$) or a silicon oxynitride (SiON) layer. A relatively thick interlevel dielectric (ILD) layer 28, for example, a CVD-$SiO_2$ and/or a doped glass, such as a borophosphosilicate glass (BPSG), is deposited to electrically insulated the FETs on the silicon substrate 10 from the next level of integration. Now, as commonly practiced in the industry, a photoresist mask and an aniso-tropic plasma etch are used to etch borderless contact openings 2 in the ILD layer 28 to the diffused source/drain contact areas 19. Because of the nonuniformity in the ILD layer 28 across the substrate and the nonuniformities in the etch rate for etching the contact openings 2 across the substrate, it is necessary to overetch the contact openings 2 to insure that the multitude of contacts openings formed are all completely opened. Unfortunately, when these borderless contact openings 2 are etched that extend over the STI 12, the STI is over etched in the region X at the STI-silicon substrate interface. When the over etched region X extends below the shallow diffused junction $x_j$ for either N or P doped source/drain contacts 19 and the silicon substrate 10 are electrically shorted and the circuits fail.

Numerous methods for making improved Salicide FETs, and borderless contacts have been reported in the literature. In U.S. Pat. No. 5,858,846 to Tsai et al. a method for making salicide FETs is describe in which arsenic ions are implanted in a titanium (Ti) metal layer prior to annealing to inhibit Si diffusion in Ti and eliminate bridging between the source/drain and gate electrode. In U.S. Pat. No. 5,744,395 to Shue et al., a Ti layer is deposited at an elevated temperature to form a silicide which is removed in a wet etch and then requires only a single RTA. In U.S. Pat. No. 5,702,972 to Tsai et al., a double spacer method is described in which the second spacer is removed after the silicide is formed. In U.S. Pat. No. 5,899,742 to Sun, a method is described for making aligned local inter-connections and contacts simultaneously to FETs. The method is compatible with salicide FETs, but he does not address the overetch problem. In U.S. Pat. No. 5,840,624 to Jang et al. a method is described for etching borderless contacts on multilevel metal layers without overetching, but does not address etching contacts to shallow diffused junction adjacent to STI. Therefore there is still a need in the industry to provide salicide FET structures with better borderless contacts to the source/drain contacts when shallow trench isolation (STI) is used for advance circuit structures.

SUMMARY OF THE INVENTION

A principal object of this invention is to provide a process and structure for making salicide field effect transistors (FETs) with improved borderless contacts to the source/drain contact areas for increased product (device) yield.

It is another object of this invention to achieve these improved borderless contacts by ion implanting a contact dopant in the contact openings after a first rapid thermal anneal (RTA) and prior to a second RTA used to form the salicide FETS. This implant results in a modified source/drain contact diffused junction profile in the silicon substrate under and adjacent to any unintentionally overetched field oxide (STI) regions at the STI-substrate interface, thereby reducing source/drain-to-substrate electrical shorts.

It is still another object of the invention to provide an improved borderless contact structure without increasing the thermal budget (temperature x time) while providing a simple and cost effective manufacturing process.

In accordance with the present invention, a method is described for making salicide field effect transistors (FETs) with improved borderless contacts structures on the source/drain areas of the FETs. The novel method utilizes a contact dopant implanted in the borderless contact openings after the first rapid thermal anneal (RTA-1) and before the second RTA (RTA-2) used to make the Salicide FET. The implanted dopant is of the same polarity as the doped source/drain contact areas of the FET. This implant forms a modified diffused junction in the silicon substrate around any over-etch STI at the STI-source/drain interfaces and prevents source/drain-to-substrate electrical shorts when conducting plugs are later formed in the borderless contact openings. The method is described for N-channel salicide FETs on a $P^-$ doped substrate, but the method equally applies to making P-channel FETs by reversing the polarities of the dopants. Further by forming P and N-doped wells in the substrate and using appropriate ion implant block-out masks both P-channel and N-channel salicide FETs can be made on the same substrate with these improved borderless contacts. The method is suitable for making CMOS logic circuits that includes embedded memory (Em)/logic applications, such as Em-SRAMs and Em-DRAMs.

The method consist of providing a semiconductor substrate doped with a first conductive type dopant. The substrate typically is single crystal silicon and is doped with P-type dopant, such as boron (B). A shallow trench isolation (STI) field oxide (FOX) areas is formed in and on the substrate and surrounds and electrically isolates device areas on the substrate. A thin gate oxide is formed on the device areas usually by growing a silicon oxide ($SiO_2$) layer by thermal oxidation. A conductively doped polysilicon layer is formed by depositing a polysilicon which is doped with an N-type conductive dopant. The N doped polysilicon layer is patterned to include gate electrodes over device areas. Next lightly doped source/drain areas are formed in the device areas adjacent to said gate electrodes by ion implantation, using a second conductive type dopant (N-dopant), such as arsenic ions ($As^{75}$) or phosphorus ($P^{31}$). Insulating sidewall spacers are formed on the sidewalls of the gate electrodes by depositing a conformal silicon oxide layer by chemical vapor deposition (CVD) and anisotropically plasma etching back the CVD-$SiO_2$. During the etch back, the top surface of the polysilicon gate electrodes and the source/drain contact areas are exposed. Next, optional, heavily doped source/drain contact areas are formed in the device areas adjacent to the sidewall spacers by ion implanting a the second conductive type dopant, such as As or P. The self-aligned silicide (SALICIDE) FETs are formed next by depositing a relatively thin conformal metal layer, such as titanium (Ti) or cobalt (Co), on the substrate over the gate electrodes and the device areas; A first thermal anneal, preferably a rapid thermal anneal (RTA-1) is carried out to selectively form a silicide layer ($TiSi_x$ or a $CoSix$) on the top surface of the gate electrodes and on the source/source/drain contact areas. The unreacted metal layer on the oxide sidewall spacer and other oxide surfaces (e.g. STI) is then removed by selectively wet etching. Next, a conformal etch stop/barrier layer, composed of $Si_3N_4$ or silicon oxynitride (SiON), is deposited by CVD. An interlevel dielectric (ILD) layer, for example composed of CVD-$SiO_2$ is deposited over the etch stop layer and provides electrical insulation for the next level of electrical interconnection. The ILD layer is typically planarized. Next, borderless contact openings are etched in the ILD layer to the source/drain areas. These borderless contact openings extend over the field oxide. Typically, because of the non-uniformity of the ILD layer and the nonuniformity etch rate across the substrate it is necessary to over etch to insure that all contacts openings are open across the substrate. Unfortunately, this results in over etching the field oxide regions (STI) at the field oxide-source/drain area interface and results in source/drain-to-substrate shorts when conducting plugs, such as metal plugs, are subsequently formed in the contact openings. Now, by the method of this invention, a contact dopant is ion implanted in the substrate under and adjacent to the over-etched field oxide regions in the borderless contact openings. The second thermal anneal, preferably a second RTA (RTA-2), is performed to complete the phase transition of the metal silicide (to reduces sheet resistance) and concurrently to active the ion implanted contact dopant to form source/drain contact areas that are continuous around the over-etched field oxide regions. This modified diffused metallurgical junction reduces the electrical shorts when conducting plugs are later formed in the borderless contact openings. Since the contact implant is integrated into the salicide FET process the thermal budget for the process is not increased, which is essential for future shallow junction devices.

BRIEF DESCRIPTION OF THE DRAWINGS

The embodiment of this invention is best under-stood with reference to the following drawings.

FIG. 1 shows a prior art cross-sectional schematic view of a conventional salicide FET that illustrate the unavoidable over-etch problem in a borderless contact openings.

FIGS. 2–5 show a schematic cross-sectional view through a salicide FET for the sequence of process step for making the improved salicide FETs with the modified border-less contact openings.

DESCRIPTION OF THE PREFERRED EMBODIMENTS

Figure 4:
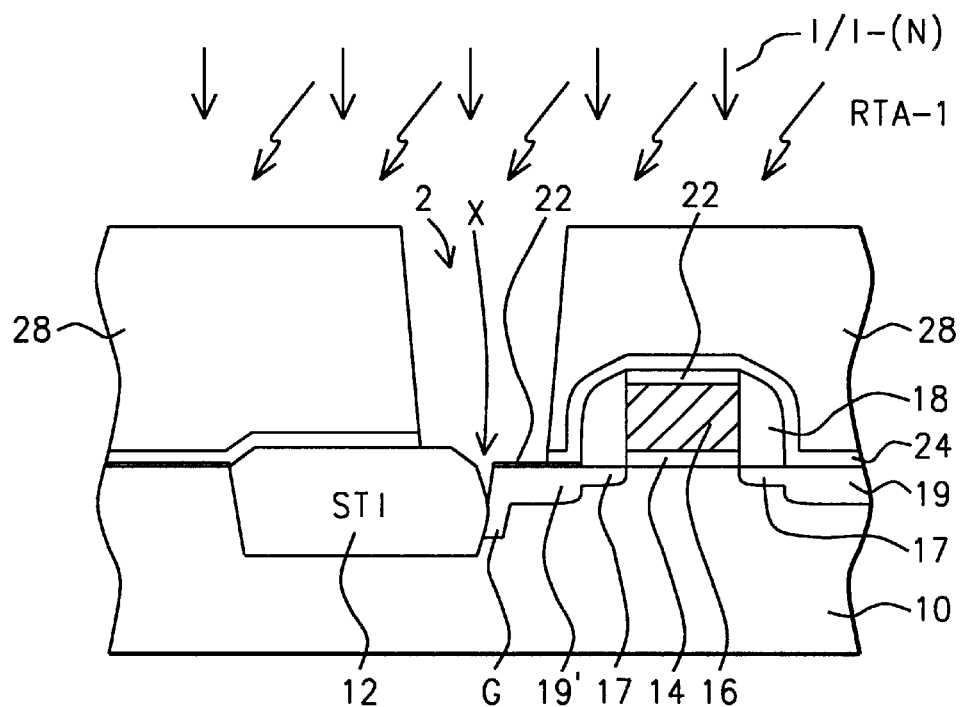

Referring now to FIGS. 1 through 4, the preferred embodiment is shown for making salicide field effect transistors (FETs) with improved borderless contacts to the source/drain contact areas of the FETs. The process in described in detail for making only N-channel salicide FETs on a $P^-$ doped silicon substrate, but it should be well understood by those skilled in the art that P-channel salicide FETs can also be fabricated by reversing the conductive polarity of the dopant. It should also be understood that by including both N doped and P doped well regions in the substrate, and by including additional selective ion implant steps, that both N-channel and P-channel FETs having these improved borderless contacts can be fabricated simultaneously on the same substrate. This allows one to fabricate CMOS circuits and also embedded memory devices such as Em-SRAM and Em-DRAM.

Referring to FIG. 2, The method begins by providing a semiconductor substrate 10. The substrate 10 is typically a P⁻ doped single crystal silicon having a crystallographic axis of <100>. A Field OXide (FOX) 12 is formed in the silicon substrate 10 surrounding and electrically isolating device areas in which the salicide FETs are formed. For very high density circuits the preferred FOX is a shallow trench isolation (STI). The method of forming the STI is briefly described and consist of forming a relatively thin stress release oxide (pad oxide) and a silicon nitride ($Si_3N_4$) layer on the substrate surface as an oxidation-resistant mask (the pad oxide and nitride layers are not shown in FIG. 2). Conventional photolithographic techniques and plasma etching are use to etch openings in the oxide/nitride layer and shallow trenches are etched in the substrate while retaining the $Si_3N_4$ layer over the device areas. An insulating layer, such a chemical vapor deposited (CVD) silicon oxide ($SiO_2$), is deposited on the substrate and chemically mechanically polished (CMP) back to the silicon nitride layer to form the STI 12. After removing the $Si_3N_4$ layer and pad oxide, the STI is essentially coplanar with the substrate surface, as shown in FIG. 2. The STI is typically between about 2500 and 4500 Angstroms thick.

Continuing with FIG. 2, A gate oxide 14 is formed on the device areas. Typically the gate oxide is formed by performing a dry thermal oxidation in an oxidation furnace using oxygen as the ambient gas. The gate oxide 14 is grown to a thickness of between about 48 and 50 Angstroms. Next a blanket polysilicon layer 16 is deposited on the substrate and over the gate oxide layer 14 and the field oxide areas 12. Preferably polysilicon layer 16 is deposited by low pressure chemical vapor deposition (LPCVD) using a reactant gas such as silane ($SiH_4$). The thickness of layer 16 is between about 1000 and 3000 Angstroms. Layer 16 is then conductively doped N⁻type by ion implanting arsenic ($As^{75}$) or phosphorus ($P^{31}$). Alternatively the polysilicon can be doped in situ by adding a dopant gas, such as arsine ($AsH_3$) or phosphine ($PH_3$) during the LPCVD deposition. The final dopant concentration of layer 16 after implantations or after in situ doping is preferred between about 1.0 E 18 and 1.0 E 21 ions/cm³. Conventional photolithographic techniques and anisotropic plasma etching are used to pattern the polysilicon layer 16 which includes forming gate electrodes over the device areas. Polysilicon layer is plasma etched using reactive ion etching (RIE) or high density plasma (HDP) etching and an etchant gas, such as chlorine ($Cl_2$).

After removing the photoresist mask, for example by plasma ashing in oxygen ($O_2$), lightly doped source/drain (LDD) areas 17 are formed in the device areas adjacent to said gate electrodes 16 by ion implantation, using a second conductive type dopant, such as As or P. Typically the LDD areas are doped to a concentration of between about 1.0 E 16 and 1.0 E 18 atoms/cm³. Next, a conformal insulating layer 18 is deposited and anisotropically plasma etched back to form sidewall spacers 18 on the sidewalls of the gate electrodes 16. Typically layer 18 is silicon oxide ($SiO_2$) and is deposited by low pressure CVD (LPCVD) using tetra-ethosiloxane (TEOS) as the reactant gas, and is deposited to a preferred thickness of about 1000 and 3000 Angstroms. The etch back is carried out using RIE and an etchant gas such as carbon tetrafluoride ($CF_4$) and hydrogen $H_2$ or methylfluoride ($CHF_3$), which etches the $SiO_2$ layer 18 selectively to the silicon substrate 10 and polysilicon gate electrode 16. Heavily doped source/drain contact areas 19 are then formed in the device areas adjacent to the insulating sidewall spacers 18 by ion implanting a second conductive type dopant, such as arsenic, The contact areas 19 are doped to a final concentration of 1.0 E 18 and 1.0 E 21 atoms/cm³. Any residual native oxide remaining on the source/drain contact areas 19 and the exposed top surface of the polysilicon gate electrodes 16 is removed using a dip etch in a dilute hydrofluoric acid solution. A conformal metal layer is deposited on the substrate. The metal is preferably titanium (Ti) or cobalt (Co) and is deposited to a thickness of between about 40 and 400 Angstroms. For example, the Ti or Co can be deposited by physical sputter deposition. Alternatively, the Ti can be deposited by CVD using $TiCl_4$ as the reactant gas, The substrate is subjected to a first rapid thermal anneal (RTA-1) to selectively form a metal silicide layer 22 on the polysilicon gate 16 and the source/drain contact areas 19, as depicted in FIG. 2. The RTA-1 is preferably carried out in a nitrogen ambient at a temperature of between about 600 and 750° C. and for a time of between about 10 and 50 seconds for titanium. For cobalt the RTA-1 is carried out at a temperature of between about 400 and 600° C. and for a time of between about 10 and 50 seconds for cobalt. This anneal is sufficient to form a silicide in a metastable phase, (commonly referred to as the C49 phase) but short enough to prevent electrical shorts between the source/drain and gate electrode due to the rapid diffusion of silicon atoms in the Ti layer on the sidewall spacer 18 prior to removing the unreacted Ti or Co.

Still referring to FIG. 2, the unreacted metal on the insulating sidewall spacers 18 and elsewhere on insulating surfaces of the substrate, such as on the STI areas 12 is removed using a wet etch. The unreacted metal Ti or Co are removed a solution of $NH_4OH:H_2O_2:H_2O$ while the $TiSi_x$ or $CoSi_x$ remains on the source/drain contact 19 and gate electrodes 16, thereby forming the salicide FET.

After removing the unreacted metal it is common practice in the industry to carry out a second rapid thermal anneal (RTA-2) to convert the $TiSi_x$ or $CoSi_x$ to a second phase, commonly referred to as the C54 phase, to reduce the sheet resistance of the silicide. However, a key feature of this invention is to delay the RTA-2 until after performing a contact opening ion implant at a later process step.

Continuing with FIG. 3, a conformal etch stop layer 24 is deposited. The etch stop layer is preferably silicon nitride ($Si_3N_4$) and is deposited by LPCVD using $SiCl_2H_2$ and $NH_3$ as the reactant gases and is deposited at a temperature of between 650 and 750° C. Alternatively the $Si_3N_4$ can be deposited by plasma enhanced CVD (PECVD) at a temperature of between about 200 and 350° C. The $Si_3N_4$ layer 24 is deposited to a preferred thickness of between about 100 and 500 Angstroms. Next, an interlevel dielectric (ILD) layer 28 is deposited to electrically insulate the devices (FET's) on the substrate and minimize the interlevel capacitance. The ILD layer 28 is typically silicon oxide and is deposited by LPCVD using TEOS or TEOS/ozone as the reactant gases. Alternatively, other ILD materials can be used, such a doped glass or low dielectric insulators. The ILD layer 28 is formed to a preferred thickness of between about 4000 and 10000 Angstroms over the FETs. For very high density circuits ILD layer 28 is usually planarized, for example by chemical mechanical polishing or using a planarizing plasma etch-back, as depicted in FIG. 3.

Next as shown in FIG. 3, conventional photolithographic techniques and anisotropic plasma etching are used to etch contact openings 2 are etched in the ILD layer 28 to the source/drain areas 19. To achieve high device density it is common practice in the industry to etch the contacts extending over the shallow trench isolation (STI) 12, commonly referred to as borderless contacts. Because of the inherent nonuniformities in the ILD layer 28 across the substrate 10 during deposition and the nonuniformities in the etch rate across the substrate, it is necessary to over etch in the contact openings 2 to insure that all contacts are open to the substrate surface. Unfortunately, this results in some of the STI 12 being over etched at the STI-source/drain interface (X) as depicted in FIG. 3, and results in source/drain-to-substrate shorts when conducting plugs (e.g. tungsten plugs) are formed in the contact openings 2.

Now as shown in FIG. 4, a key feature of this invention is to perform a contact opening ion implantation I/I(N). For the N-channel FET depicted in FIGS. 2–4, the ion implant is of the second conductive type dopant (N-type dopant) and is implanted in the substrate 10 under and adjacent to the over-etched STI regions X. This result in a modified diffused source/drain contact 19' having an extended portion G under and along side the over-etched STI region I. During implantation of the N-type dopant, a block-out implant photoresist mask is used to protect other areas from implantation, such as contact openings etched to the source/drain areas of the P-channel FETs on the same substrate. The N-type dopant implant is preferably phosphorus ($P^{31}$) ions having an implant dose of between about 5.0 E 12 and 1.0 E 15 atoms/cm$^2$ at an implant energy of about 50 KeV. Although the process for making these improved borderless contacts is described for N-channel FETs, the process is equally applicable to making borderless contacts to P-channel FETs. By using a second photoresist implant block-out masks to prevent implanting in the N-doped contacts one can also implant a P-type dopant, such as Boron ($B^{11}$), to form an improved borderless contact structure for the P-channel FETs on the same substrate. The P-type dopant is preferably boron ($B^{11}$) and is implanted to a preferred dose of between about 5.0 E 12 and 1.0 E 15 atoms/cm$^2$ and at an implant energy of about 10 KeV. To simplify the drawings the P-channel FETs are not shown in the Figures.

Continuing with FIG. 4, a second thermal anneal is performed to complete the phase transition of the metal silicide 22 on the source/drain contact areas 19' and the polysilicon gate electrodes 16, and concurrently activate the ion implanted contact dopant. The second thermal anneal is also a rapid thermal anneal (RTA-2) and is carried out in a nitrogen ambient at a temperature of between about 700 and 900 degrees centigrade (° C.) and for a time of between about 10 and 50 seconds, and more specifically at a temperature of 880° C. for 30 seconds for the titanium silicide, and at a temperature of 850° C. for 30 seconds for the Co silicide.

By delaying the second rapid thermal anneal (RTA-2) the silicides is converted to the low resistance silicide phase and, at the same time, electrically activating the contact opening implant dopant I/I-(N) to form an improved source/drain n-p junction 19 structure having a portion G that extends around and under the unavoidable over etch region X in the STI 12. By delaying the RTA-2 the total thermal budget (temperature x time) is not increased which is essential for making future shallow junction FETs. The structure and method is suitable for making devices with minimum feature sizes of 0.18 micrometers or less.

Figure 5:
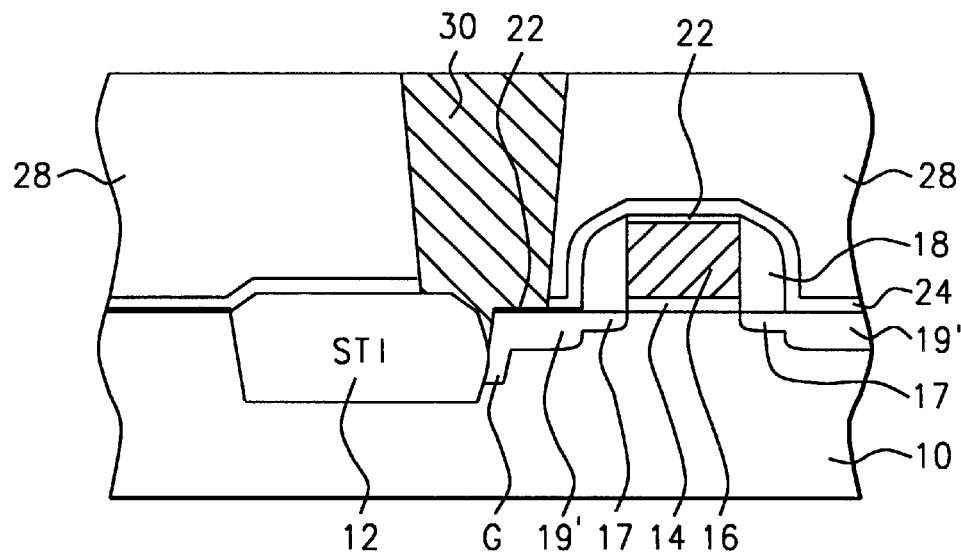

Referring to FIG. 5, the borderless contact openings 2 can now be filled with various conducting material without causing electrical shorts between the source/drain 19' and the substrate 10. One method of forming contacts is to deposit a refractory metal 30, such as tungsten (W) which is then etched back or chemically mechanically polished (CMP) back to form metal plugs 30.

EXAMPLE

To better appreciate the advantages of this invention, substrates (commonly referred to as wafer) where fabricated having salicide FET device formed by the method of this invention and by the conventional method. The test results are shown the TABLE below. Column 1 is the wafer number, column 2 is the total die tested, col. 3 is number of die testing good, col. 4 is the functional fails (random single bit fails) and col. 5 is the final test yields in percentage. Normally some of the fails were caused by borderless contact over-etching resulting in electrical shorts to the substrate. The fails were measured as bit fails of the SRAM cell or by excessive standby currents, where the compliance current is <50 milliamperes (uAmp). The total number of tested die on each wafer is 250. The wafers 1–6 and 10–11, labeled INV. were process by the method of this invention and the wafer 7–9, labeled CONV received the standard (conventional) process. Each die contains more than 4 million N-channel salicide FETs and more than 2.0 million P-channel salicide FETs. The circuit devices are static random access memory (SRAM) and include about 1.5 million embedded SRAM cells with logic.

TABLE

| 1 WAFERS \ | 2 TOTAL TESTED | 3 TESTED GOOD | 4 FUNCTION FAILS | 5 FINAL YIELD |
|---|---|---|---|---|
| 01 INV | 250 | 158 | 72 | 65.0 |
| 02 INV | 250 | 149 | 64 | 62.1 |
| 03 INV | 250 | 136 | 79 | 56.7 |
| 04 INV | 250 | 136 | 88 | 56.7 |
| 05 INV | 250 | 132 | 89 | 55.0 |
| 06 INV | 250 | 155 | 67 | 64.6 |
| 07 CONV | 250 | 71 | 144 | 29.6 |
| 08 CONV | 250 | 51 | 163 | 21.2 |
| 09 CONV | 250 | 79 | 136 | 32.9 |
| 10 INV | 250 | 140 | 71 | 58.3 |
| 11 INV | 250 | 154 | 70 | 64.2 |

As is clearly seen from the functional fail test (col 4), the conventional process (wafers 7–9) had about twice the failure rate than the inventive process (wafer 1–6 and 10–11). The final test yields (col 5) also show that the salicide FETs with the improved borderless contact structure of this invention had a final yield of about 60% while the conventional process had a final yield of less than 30%.

While the invention has been particularly shown and described with reference to the preferred embodiments thereof, it will be understood by those skilled in the art that various changes in form and details may be made without departing from the spirit and scope of the invention.

What is claimed is:

1. A method for fabricating Salicide field effect transistors with improved borderless contacts openings comprising the steps of:

providing a semiconductor substrate doped with a first conductive type dopant;

forming shallow trench field oxide areas in and on said substrate surrounding and electrically isolating device areas on said on said substrate;

forming a gate oxide layer on said device areas;

depositing a conductively doped polysilicon layer on said substrate and over said device areas;

patterning said polysilicon layer to form gate electrodes over said device areas;

forming lightly doped source/drain areas in said device areas adjacent to said gate electrodes by ion implantation, using a second conductive type dopant;

forming insulating sidewall spacers on the sidewalls of said gate electrodes;

forming heavily doped source/drain contact areas in said device areas adjacent to said insulating sidewall spacers by ion implantation a second conductive type dopant;

depositing a conformal metal layer on said substrate over said gate electrodes and said device areas;

using a first thermal anneal to anneal said metal layer and thereby selectively forming a silicide layer on said gate electrodes and on said source/drain contact areas;

selectively etching said remaining unreacted metal layer and thereby forming said Salicide field effect transistors;

depositing a conformal etch stop layer;

depositing an interlevel dielectric layer;

etching said borderless contact openings in said interlevel dielectric layer to said source/drain areas and extending over said field oxide, wherein said etching results in over-etched field oxide regions at said field oxide-source/drain area interface;

ion implanting a contact dopant of said second conductive type in said borderless contact openings and in said substrate under and adjacent to said over-etched field oxide regions;

using a second thermal anneal to complete the phase transition of said metal silicide and concurrently activating said ion implanted contact dopant to form source/drain contact areas that are continuous around said over-etched field oxide regions.

2. The method of claim 1, wherein said semiconductor substrate is single crystal silicon.

3. The method of claim 1, wherein shallow trench isolation is silicon oxide and has a depth of between about 2500 and 4500 Angstroms and is coplanar with the surface of said substrate.

4. The method of claim 1, wherein said conductively doped polysilicon layer has a thickness of between about 1000 and 3000 Angstroms.

5. The method of claim 1, wherein said metal layer is titanium and is deposited to a thickness of between about 40 and 400 Angstroms.

6. The method of claim 1, wherein said metal layer is cobalt and is deposited to a thickness of between about 40 and 400 Angstroms.

7. The method of claim 1, wherein said unreacted metal is removed in a solution of $NH_4OH$, $H_2O_2$ and $H_2O$.

8. The method of claim 1, wherein said first thermal anneal is carried out in nitrogen at a temperature of between about 600 and 750 degrees centigrade and for a time of between about 10 and 50 seconds.

9. The method of claim 1, wherein said first conductive type dopant is a P-type dopant and said second type dopant is an N-type dopant for Salicide N-channel FETS, and the dopant types are reversed for P-channel salicide FETs.

10. The method of claim 1, wherein said second thermal anneal is carried out in nitrogen at a temperature of between about 700 and 900 degrees centigrade and 10 for a time of between about 10 and 50 seconds.

11. A method for fabricating Salicide field effect transistors with improved borderless contacts openings comprising the steps of:

providing a semiconductor substrate doped with a first conductive type dopant;

forming shallow trench field oxide areas in and on said substrate surrounding and electrically isolating device areas on said on said substrate;

forming a gate oxide layer on said device areas;

depositing a conductively doped polysilicon layer on said substrate and over said device areas;

patterning said polysilicon layer to form gate electrodes over said device areas;

forming lightly doped source/drain areas in said device areas adjacent to said gate electrodes by ion implantation, using a second conductive type dopant;

forming insulating sidewall spacers on the sidewalls of said gate electrodes;

forming heavily doped source/drain contact areas in said device areas adjacent to said insulating sidewall spacers by ion implantation a second conductive type dopant;

depositing a conformal titanium metal layer, on said substrate over said gate electrodes and said device areas;

using a first thermal anneal to anneal said metal layer and thereby selectively forming a titanium silicide layer on said gate electrodes and on said source/drain contact areas;

selectively etching said remaining unreacted metal layer and thereby forming said Salicide field effect transistors;

depositing a conformal etch stop layer;

depositing an interlevel dielectric layer;

etching said borderless contact openings in said interlevel dielectric layer to said source/drain areas and extending over said field oxide, wherein said etching results in over-etched field oxide regions at said field oxide-source/drain area interface;

ion implanting a contact dopant of said second conductive type in said borderless contact openings and in said substrate under and adjacent to said over-etched field oxide regions;

using a second thermal anneal to complete the phase transition of said metal silicide and concurrently activating the ion implanted contact dopant to form source/drain contact areas that are continuous around said over-etched field oxide regions.

12. The method of claim 11, wherein said semiconductor substrate is single crystal silicon.

13. The method of claim 11, wherein shallow trench isolation is silicon oxide and has a depth of between about 2500 and 4500 Angstroms and is coplanar with the surface of said substrate.

14. The method of claim 11, wherein said conductively doped polysilicon layer has a thickness of between about 1000 and 3000 Angstroms.

15. The method of claim 11, wherein said metal layer is titanium and is deposited to a thickness of between about 40 and 400 Angstroms.

16. The method of claim 11, wherein said metal layer is cobalt and is deposited to a thickness of between about 40 and 400 Angstroms.

17. The method of claim 11, wherein said unreacted metal is removed in a solution of $NH_4OH$, $H_2O_2$ and $H_2O$.

18. The method of claim 11, wherein said first thermal anneal is carried out in nitrogen at a temperature of between about 600 and 750 degrees centigrade and for a time of between about 10 and 50 seconds.

19. The method of claim 11, wherein said first conductive type dopant is a P-type dopant and said second type dopant is an N-type dopant for Salicide N-channel FETS, and the dopant types are reversed for P-channel salicide FETs.

20. The method of claim 11, wherein said second thermal anneal is carried out in nitrogen at a temperature of between about 700 and 900 degrees centigrade and for a time of between about 10 and 50 seconds.

* * * * *